United States Patent
Hirakawa et al.

(10) Patent No.: US 11,254,870 B2
(45) Date of Patent: Feb. 22, 2022

(54) ETCHING SOLUTION, ADDITIVE, AND ETCHING METHOD

(71) Applicant: KABUSHIKI KAISHA TOSHIBA, Minato-ku (JP)

(72) Inventors: Masaaki Hirakawa, Yokohama (JP); Ikuo Uematsu, Yokohama (JP); Takahiro Kanai, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/784,316

(22) Filed: Feb. 7, 2020

(65) Prior Publication Data

US 2020/0308485 A1 Oct. 1, 2020

(30) Foreign Application Priority Data

Mar. 26, 2019 (JP) .............................. JP2019-059172

(51) Int. Cl.

| | |
|---|---|
| *C09K 13/06* | (2006.01) |
| *H01L 21/306* | (2006.01) |
| *C09K 13/10* | (2006.01) |
| *C09K 13/08* | (2006.01) |
| *H01L 21/311* | (2006.01) |
| *H01L 21/3213* | (2006.01) |
| *C23F 1/14* | (2006.01) |
| *C23F 1/10* | (2006.01) |

(52) U.S. Cl.
CPC .............. *C09K 13/06* (2013.01); *C09K 13/08* (2013.01); *C09K 13/10* (2013.01); *H01L 21/30604* (2013.01); *H01L 21/30608* (2013.01); *H01L 21/30617* (2013.01); *H01L 21/31105* (2013.01); *H01L 21/31111* (2013.01); *H01L 21/32134* (2013.01); *C23F 1/10* (2013.01); *C23F 1/14* (2013.01)

(58) Field of Classification Search
None
See application file for complete search history.

(56) References Cited

U.S. PATENT DOCUMENTS

| | | | | |
|---|---|---|---|---|
| 3,859,222 | A * | 1/1975 | Squillace | H01L 21/31111 252/79.3 |
| 6,117,351 | A * | 9/2000 | Li | C03C 15/00 216/95 |
| 8,211,810 | B2 | 7/2012 | Kiyose | |
| 9,868,902 | B2 * | 1/2018 | Lee | H01L 21/0214 |
| 2008/0203060 | A1 * | 8/2008 | Hara | H01L 21/31111 216/99 |
| 2015/0111311 | A1 * | 4/2015 | Changchien | H01L 21/31111 438/5 |

(Continued)

FOREIGN PATENT DOCUMENTS

| | | |
|---|---|---|
| JP | 2005-268605 A | 9/2005 |
| JP | 2009-21538 A | 1/2009 |

(Continued)

*Primary Examiner* — Stephanie P Duclair
(74) *Attorney, Agent, or Firm* — Oblon, McClelland, Maier & Neustadt, L.L.P.

(57) ABSTRACT

According to one embodiment, an etching solution is provided. The etching solution is used for etching of silicon nitride. The etching solution includes: phosphoric acid; tetrafluoroboric acid; a silicon compound; water; and at least one of sulfuric acid and an ionic liquid.

5 Claims, 3 Drawing Sheets

(56) References Cited

U.S. PATENT DOCUMENTS

2015/0299568 A1* 10/2015 Nakako ................ C09K 13/00
　　　　　　　　　　　　　　　　　　　　　136/252
2017/0154785 A1　　6/2017　Yoshimizu et al.

FOREIGN PATENT DOCUMENTS

| | | |
|---|---|---|
| JP | 2009-94455 A | 4/2009 |
| JP | 2017-103336 A | 6/2017 |
| TW | 200849371 A | 12/2008 |
| TW | 201802231 A | 1/2018 |

* cited by examiner

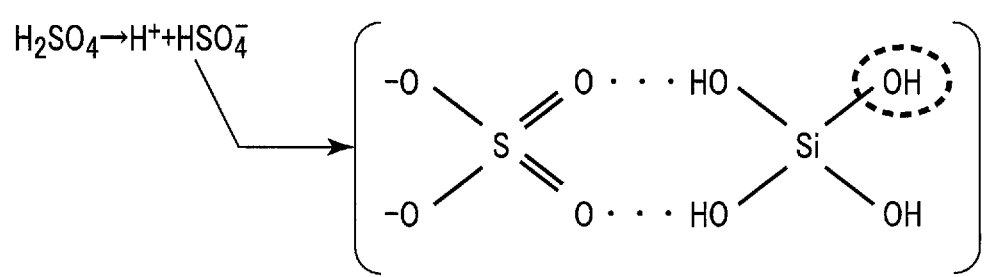
F I G. 1

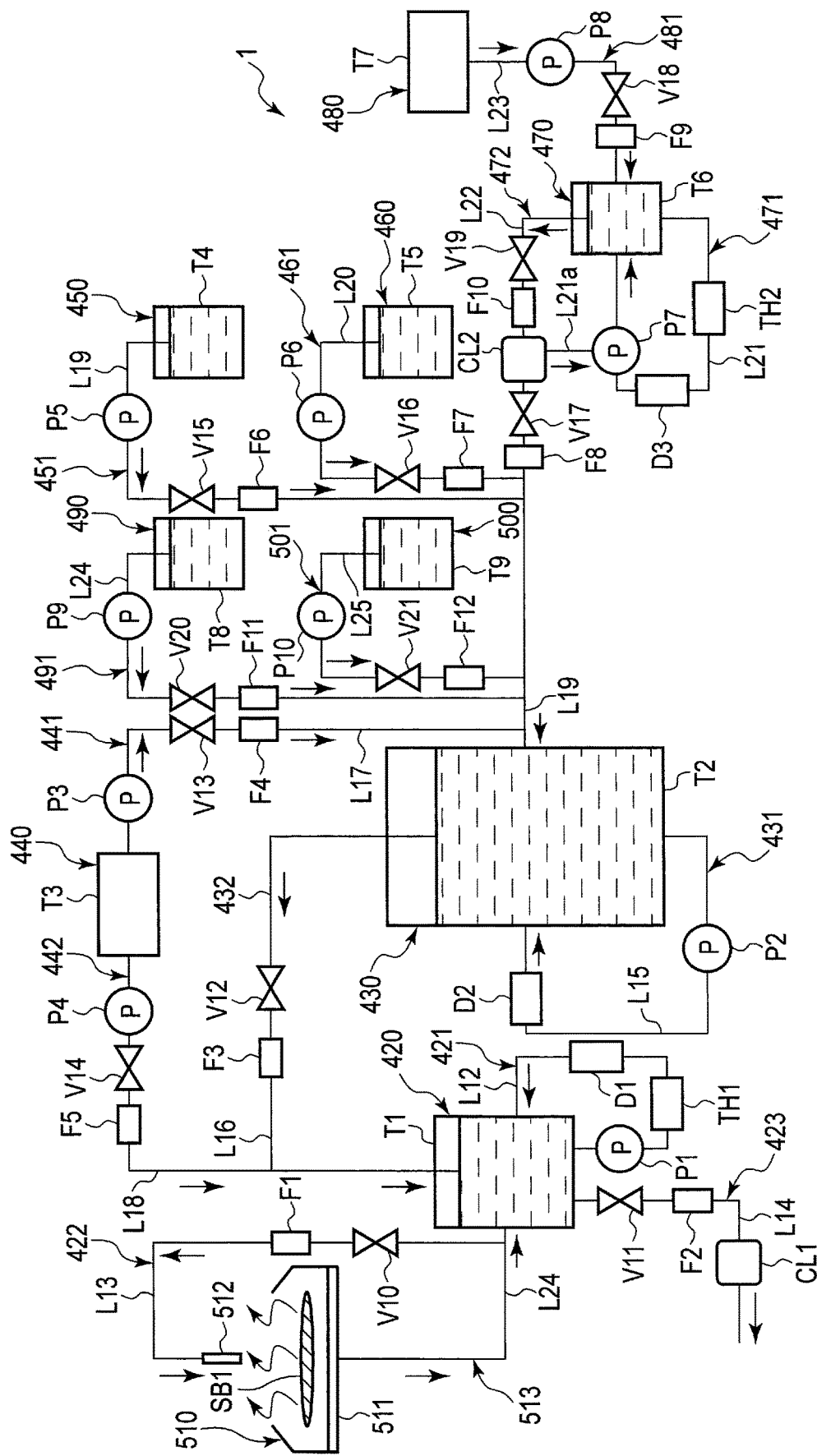
F I G. 2

ETCHING SOLUTION, ADDITIVE, AND ETCHING METHOD

CROSS-REFERENCE TO RELATED APPLICATIONS

This application is based upon and claims the benefit of priority from Japanese Patent Application No. 2019-059172, filed Mar. 26, 2019; the entire contents of which is incorporated herein by reference.

FIELD

Embodiments of the present invention relate to an etching solution, an additive, and an etching method.

BACKGROUND

In recent years, in the manufacture of a semiconductor device, a technique for selectively removing a silicon nitride layer from a substrate including a silicon oxide ($SiO_2$) layer and a silicon nitride ($Si_3N_4$) layer is demanded. As such a technique, wet etching using a phosphoric acid aqueous solution is widely used.

In this wet etching, an increase of the ratio of the etching rate of silicon nitride to the etching rate of silicon oxide, namely a selection ratio, is demanded. As a method for increasing the selection ratio, wet etching using a phosphoric acid aqueous solution containing tetrafluoroboric acid is studied.

BRIEF DESCRIPTION OF THE DRAWINGS

FIG. 1 is an illustration describing the function of sulfuric acid as a polymerization inhibitor for silicic acid;
FIG. 2 is a cross sectional view schematically illustrating an example of a single wafer etching apparatus.

DETAILED DESCRIPTION

Figure 3:
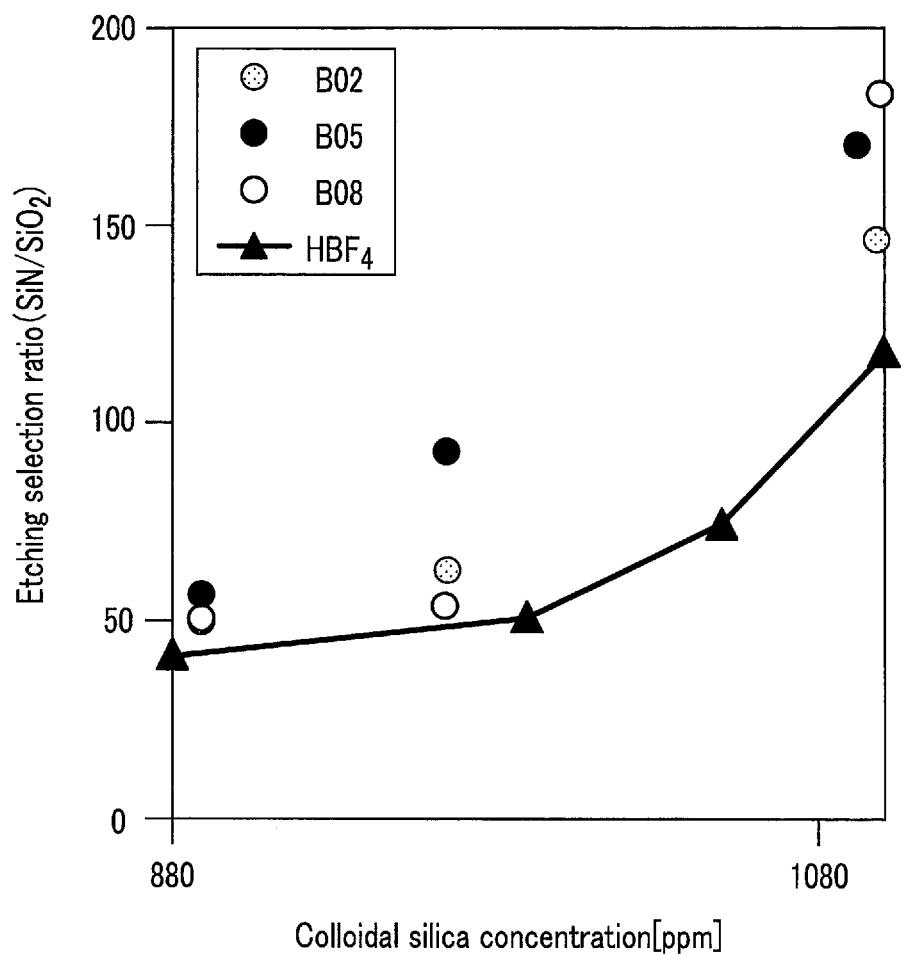
FIG. 3 is a graph showing an example of the relationship between the colloidal silica concentration and the selection ratio.

According to a first embodiment, an etching solution is provided. The etching solution is used for etching of silicon nitride. The etching solution includes: phosphoric acid; tetrafluoroboric acid; a silicon compound; water; and at least one of sulfuric acid and an ionic liquid.

According to a second embodiment, an additive is provided. The additive is used for an etching solution for silicon or a silicon containing substance. The additive includes an ionic liquid.

According to a third embodiment, an etching solution is provided. The etching solution includes: the additive according to the second embodiment; and an acidic aqueous solution.

According to a fourth embodiment, an etching method is provided. The etching method includes etching of silicon nitride using the etching solution according to the first embodiment.

According to a fifth embodiment, an etching method is provided. The etching method includes etching of silicon or a silicon containing substance using the etching solution according to the third embodiment.

Embodiments are described below with reference to drawings.

First Embodiment

An etching solution according to a first embodiment is used for etching of silicon nitride. In particular, the etching solution is suitable for selectively removing silicon nitride alone from a structure including silicon oxide and silicon nitride.

The etching solution according to the first embodiment includes phosphoric acid, tetrafluoroboric acid, a silicon compound, water, and at least one of sulfuric acid and an ionic liquid.

The etching solution according to the first embodiment includes tetrafluoroboric acid that produces an etchant, a silicon compound as a selection ratio improver, and at least one of sulfuric acid and an ionic liquid as dust deposition inhibitors. Accordingly, when the etching solution according to the first embodiment is used, dust deposition in an etching solution after etching process can be reduced while a high selection ratio is achieved. Thus, when the etching solution according to the first embodiment is used, efficiency of the etching process can be increased. The selection ratio $ER_{SiN}/ER_{SiO}$ refers to a ratio of the etching rate of silicon nitride ($ER_{SiN}$) to the etching rate of silicon oxide ($ER_{SiO}$).

The etching mechanism of silicon nitride using the etching solution according to the first embodiment is considered to be as follows.

First, tetrafluoroboric acid ($HBF_4$) dissolves in a phosphoric acid aqueous solution at a high temperature and produces $HBF_3(OH)$ and hydrogen fluoride (HF) as represented by the following formula (1). This reaction is a reversible reaction. Since tetrafluoroboric acid and water react gently with each other, the composition of the etching solution can be easily controlled.

$$HBF_4 + H_2O \leftrightarrow HBF_3(OH) + HF \qquad (1)$$

Hydrogen fluoride acts as an etchant to silicon nitride ($Si_3N_4$), and decomposes silicon nitride into silicon tetrafluoride ($SiF_4$) and ammonia ($NH_3$) as represented by the following formula (2).

$$Si_3N_4 + 12HF \rightarrow 3SiF_4 + 4NH_3 \qquad (2)$$

Next, hydrogen fluoride ionizes as represented by the following formulae (3) and (4).

$$HF \rightarrow H^+ + F^- \qquad (3)$$

$$HF + F^- \rightarrow HF_2^- \qquad (4)$$

A fluoride ion ($F^-$) acts as a particularly strong etchant to silicon nitride. On the other hand, hydrogen fluoride also acts as an etchant to silicon oxide ($SiO_2$) as represented by the following formula (5), and decomposes silicon oxide into hydrosilicofluoric acid ($H_2SiF_6$) and water ($H_2O$). This reaction is a reversible reaction.

$$SiO_2 + 6HF \leftrightarrow H_2SiF_6 + H_2O \qquad (5)$$

That is, since hydrogen fluoride not only increases the etching rate of silicon nitride but also increases the etching rate of silicon oxide, the selection ratio can hardly be increased.

The etching solution according to the first embodiment contains a silicon compound as a selection ratio improver. The silicon compound is, for example, hydrosilicofluoric acid ($H_2SiF_6$). When the etching solution according to the first embodiment contains hydrosilicofluoric acid ($H_2SiF_6$) in advance, equilibrium of the reaction represented by the formula (5) hardly shifts in the rightward direction. Accordingly, the etching rate of silicon oxide decreases. As a result, when the etching solution according to the first embodiment is used, a high selection ratio can be achieved. The silicon compound can be silicon oxide ($SiO_2$) or a silicic acid compound ($Si(OH)_4$). These compounds can change into hydrosilicofluoric acid in the etching solution.

However, if the etching solution contains a silicon compound in advance, particulate dust tends to be formed during the etching process or after the etching process. The dust may be a product grown from precipitates of silicon oxide or the like. For example, silicic acid ($Si(OH)_4$) produced by etching of silicon nitride or silicon oxide is polymerized to produce a multimer represented by $SiO_n(OH)_{4-2n}$, and the multimer chemically changes into silicon oxide ($SiO_2$) to form the deposited dust.

When the dust is deposited on a substrate after etching process, a substrate cleaning step for cleaning the dust may be required after the etching process. In addition, if there is a large amount of dust in an etching solution, etching process apparatus is clogged with the dust, and thus frequent replacement of the etching solution and cleaning of a filter are required. Accordingly, if dust is produced, the etching process efficiency is reduced.

The etching solution according to the first embodiment contains at least one of sulfuric acid and an ionic liquid as dust deposition inhibitors.

Sulfuric acid is a highly effective polymerization inhibitor of the above-described silicon compound. FIG. 1 is an illustration describing the function of sulfuric acid as a polymerization inhibitor for silicic acid. As represented by the formula shown in the right side of FIG. 1, sulfuric acids each ionize into a proton ($H^+$) and a hydrogen sulfate ion ($HSO_4^-$). Part of the hydrogen sulfate ions ($HSO_4^-$) ionizes into a proton ($H^+$) and a sulfate ion ($SO_4^{2-}$). The sulfate ion ($SO_4^{2-}$) forms hydrogen bonds with hydroxyl groups of silicic acid ($Si(OH)_4$) as illustrated in FIG. 1. This can inhibit polymerization of silicic acids ($Si(OH)_4$).

An anion or a cation in the ionic liquid may be an organic substance containing at least two functional groups. Functional groups that are different from each other exert hydrophilicities that are different from each other. Thus, the anion and the cation in the ionic liquid can act as a surfactant in the etching solution. Accordingly, when the ionic liquid is used, polymerization of silicic acids or growth of precipitates can be reduced. In addition, the ionic liquid can increase the etching rate.

As described above, when the etching solution according to the first embodiment is used, both a high selection ratio and reduction of dust deposition can be achieved, and thereby treatment efficiency of etching can be increased.

In the etching solution according to the first embodiment, the concentration of the phosphoric acid is, for example, 66% by mass or more and 93% by mass or less, preferably 89% by mass or more and 93% by mass or less, more preferably 90% by mass or more and 92% by mass or less. When the phosphoric acid concentration is high, the temperature of the etching solution can be easily increased and the treatment efficiency can be easily increased. However, if the phosphoric acid concentration is excessively high, the content of water as an etchant decreases, which may result in a decrease in the etching rate.

In the etching solution according to the first embodiment, the concentration of the tetrafluoroboric acid is, for example, 0.01% by mass or more and 0.20% by mass or less, preferably 0.10% by mass or more and 0.20% by mass or less, and more preferably 0.15% by mass or more and 0.20% by mass or less. When the tetrafluoroboric acid concentration is high, concentration of hydrogen fluoride tends to be increased, and thus the etching rate can be increased. However, if the tetrafluoroboric acid concentration is excessively high, concentration of hydrogen fluoride becomes excessively high, and thus the etching rate of silicon oxide is increased, which may result in a decrease in the selection ratio.

The silicon compound can be introduced into the etching solution by, for example, dissolving a silicon compound source. Examples of the silicon compound source include silicon nitride, silicon oxide, hydrosilicofluoric acid, and mixtures thereof. The silicon compound source is preferably a silicon oxide ($SiO_2$). Since the silicon oxide dissolves in the etching solution without hydrolysis as represented by the formula (5), the composition of the etching solution can be easily controlled, and dust is further hardly deposited. The silicon compound source is preferably colloidal silica. Colloidal silica easily dissolves in the etching solution, and the etching process efficiency can be further increased.

The concentration of a silicon compound contained in the etching solution according to the first embodiment, such as the silica concentration, can be determined by measuring the silicon concentration. The silicon concentration in the etching solution according to the first embodiment is preferably 880 ppm or more and 2,500 ppm or less, and more preferably 1,100 ppm or more and 2,500 ppm or less. When the silica concentration is high, the selection ratio can be increased. However, if the silica concentration is excessively high, the amount of the deposited dust increases, which may result in a decrease in the etching process efficiency.

In the etching solution according to the first embodiment, water occupies the balance of the etching solution. The concentration of water in the etching solution according to the first embodiment is preferably 7% by mass or more and 10% by mass or less, and more preferably 8% by mass or more and 9% by mass or less. When the water concentration is high, the etching rate of silicon nitride can be increased. However, if the water concentration in the etching solution is excessively high, the temperature of the etching solution during the etching process hardly increases, which may result in a decrease in the etching process efficiency.

When the etching solution according to the first embodiment contains sulfuric acid, the concentration of sulfuric acid is preferably 10% by mass or more and 25% by mass or less, and more preferably 15% by mass or more and 25% by mass or less. When the sulfuric acid concentration is high, the dust deposition can be reduced. However, if the sulfuric acid concentration in the etching solution is excessively high, activity of water decreases, which may result in a decrease in the selection ratio.

When the etching solution according to the first embodiment contains an ionic liquid, the concentration of the ionic liquid is preferably 0.03% by mass or more and 0.50% by mass or less, and more preferably 0.03% by mass or more and 0.30% by mass or less. When the ionic liquid concentration is high, the dust deposition can be reduced and the etching rate can be increased. However, if the ionic liquid concentration in the etching solution is excessively high, the etching solution froths and flow rate regulation becomes difficult, which may result in a decrease in the etching process efficiency.

As the ionic liquid, ionic liquids included in an additive according to a second embodiment can be used. The ionic liquid is described below in detail.

Whether the etching solution according to the first embodiment includes sulfuric acid or not and the kind of the ionic liquid included in the etching solution can be determined by Liquid Chromatography-Mass spectrometry (LC-MS) and Capillary Electrophoresis-Mass spectrometry (CE-MS).

The above-described etching solution according to the first embodiment includes phosphoric acid, tetrafluoroboric acid, a silicon compound, water, and at least one of sulfuric acid and an ionic liquid. Accordingly, when the etching solution according to the first embodiment is used, deposition of dust such as silicon dioxide which can be deposited in the etching solution after etching process can be reduced while a high selection ratio is achieved. Thus, when the etching solution according to the first embodiment is used, efficiency of the etching process can be increased.

Second Embodiment

An additive according to the second embodiment is added to the etching solution used for etching of silicon or a silicon containing substance. The additive contains an ionic liquid.

The ionic liquid reduces dust deposition and increases the etching rate as described above. Accordingly, when the etching solution containing the additive according to the second embodiment is used, production of dust during the etching process can be reduced and the etching rate can be increased in comparison with the case in which an etching solution free from an ionic liquid is used, and thus the etching process efficiency can be increased.

The additive according to the second embodiment can be used for an etching solution for a material, such as silicon or a silicon containing substance, which can produce dust by etching. The silicon containing substance is, for example, silicon oxide or silicon nitride. The additive according to the second embodiment can be preferably used as an additive for an etching solution for silicon nitride, and particularly preferably used as an additive for an etching solution which is used for selectively etching only silicon nitride from a structure containing silicon nitride and silicon oxide.

As the ionic liquid, at least one selected from the group consisting of an imidazolium salt, a pyridinium salt, an ammonium salt, a phosphonium salt, a pyrrolidinium salt, a morpholinium salt, a piperidinium salt, and a sulfonium salt can be used. The ionic liquid is preferably at least one selected from the group consisting of an imidazolium salt, a pyridinium salt, an ammonium salt, a phosphonium salt, and a pyrrolidinium salt, and more preferably at least one selected from the group consisting of an imidazolium salt and a pyridinium salt.

The cation of the ionic liquid is preferably an organic substance having at least two functional groups. Examples of the cation have at least one selected from the group consisting of an imidazolium skeleton, a pyridinium skeleton, a quaternary ammonium skeleton, a quaternary phosphonium skeleton, a pyrrolidinium skeleton, a morpholinium skeleton, a piperidinium skeleton, and a sulfonium skeleton.

The anion of the ionic liquid may be an inorganic substance or an organic substance. The anion of the organic substance is, for example, p-$CH_3PhSO_3^-$, $CH_3CO_2^-$, $CF_3CO_2^-$, $CH_3SO_3^-$, $CF_3SO_3^-$, $(CF_3SO_2)_3C^-$, $C_3F_7CO_2^-$, $C_4F_9SO_3^-$, $(CF_3SO_2)_2N^-$, $(C_2F_5SO_2)_2N^-$, $(CF_3SO_2)(CF_3CO)N^-$, or $(CN)_2N^-$. The anion of the inorganic substance is, for example, $AlCl_4^-$, $NO_2^-$, $NO_3^-$, $Br^-$, $Cl^-$, $I^-$, $BF_4^-$, $PF_6^-$, $AsF_6^-$, $SbF_6^-$, $NbF_6^-$, $TaF_6^-$, or $F(HF)_{2.3}^-$.

The anion of the ionic liquid is preferably an anion which produces hydrogen fluoride in the etching solution. When this ionic liquid is used, an etching solution achieving a high etching rate of silicon or a silicon containing substance can be obtained. Examples of the anion include at least one selected from the group consisting of $BF_4^-$, $PF_6^-$, $AsF_6^-$, $SbF_6^-$, $NbF_6^-$, $TaF_6^-$, and $F(HF)_{2.3}^-$.

The anion of the ionic liquid is preferably at least one selected from the group consisting of $BF_4^-$ and $PF_6^-$ from the standpoint of easy production of hydrogen fluoride. Further, the anion is particularly preferably $BF_4^-$ from the standpoint of a gentle hydrolysis reaction and easy regulation of concentration or the like.

The ionic liquid may be liquid or solid at room temperature, and is preferably liquid at room temperature. The ionic liquid which is liquid at room temperature is hardly deposited on the processed material, which results in further increased etching process efficiency. As used herein, the "room temperature" refers to a temperature of 25° C. or more and 40° C. or less.

The ionic liquid may be water-soluble or water-insoluble, and is preferably an ionic liquid having water solubility or having water miscibility. This is because such ionic liquid has high dispersibility in the etching solution.

Examples of the ammonium salt include ammonium salts represented by the following formulae (A01) and (A02).

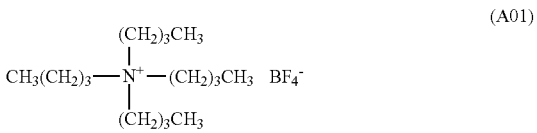

(A01)

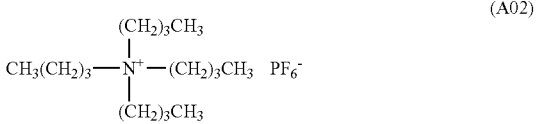

(A02)

Examples of the imidazolium salt include imidazolium salts represented by the following formulae (B01) to (B14).

(B01)

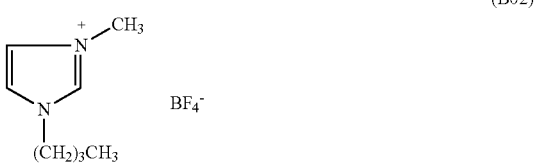

(B02)

(B03)

(B04)

(B05) 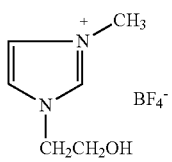

(B06) 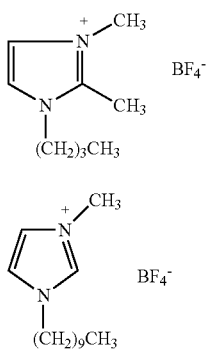

(B07)

(B08) 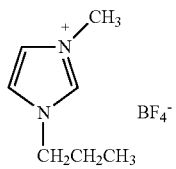

(B09) 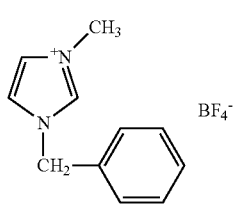

(B10) 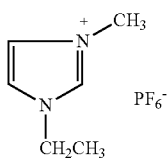

(B11) 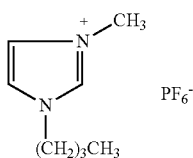

(B12) 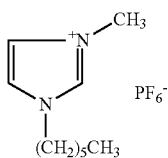

(B13) 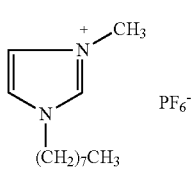

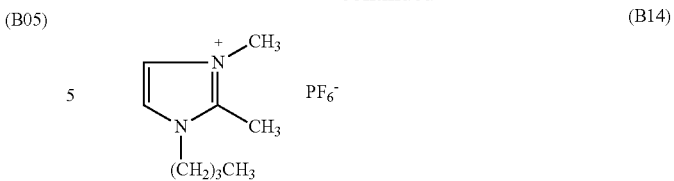
(B14)

From the standpoint of being liquid at room temperature, the imidazolium salts are preferably represented by the formulae (B01) to (B05), (B07), (B08), and (B11) to (B13). Further, from the standpoint of having water solubility or high water miscibility, the imidazolium salts are preferably represented by the formulae (B01), (B02), (B05), (B08), and (B11).

Examples of the phosphonium salt include phosphonium salts represented by the following formulae (C01) and (C02).

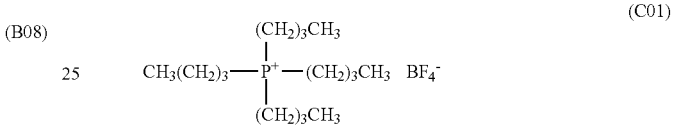
(C01)

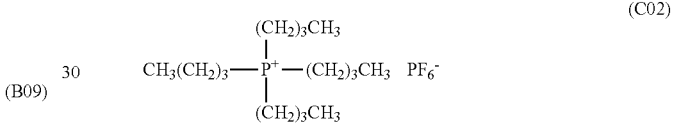
(C02)

Examples of the pyridinium salt include pyrinidium salts represented by the following formulae (D01) to (D06).

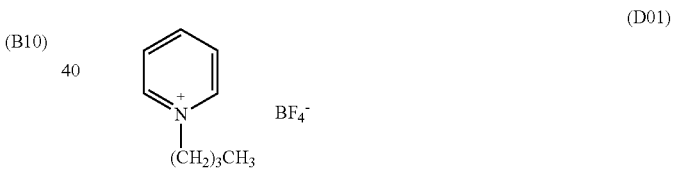
(D01)

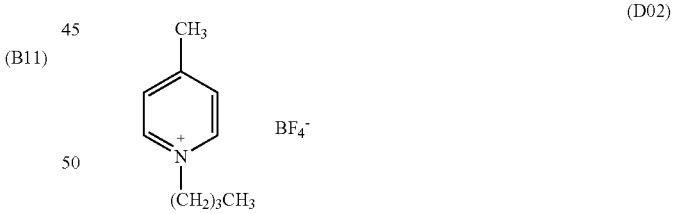
(D02)

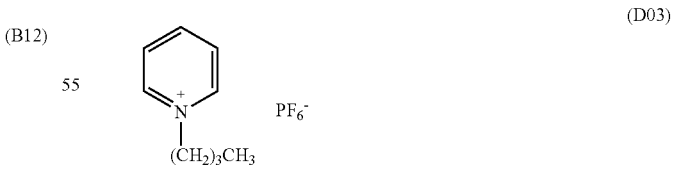
(D03)

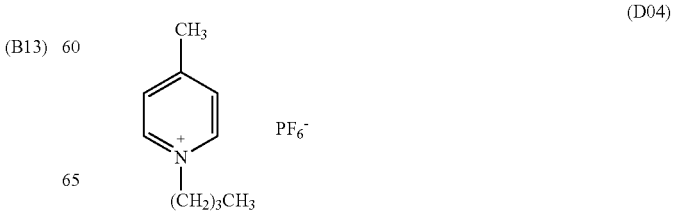
(D04)

-continued

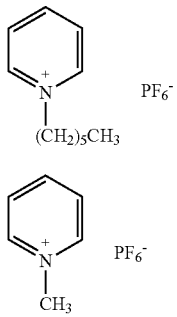

(D05)

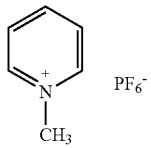

(D06)

From the standpoint of being liquid at room temperature, the pyridinium salts are preferably represented by the above-described formulae (D01) and (D02).

Examples of the pyrrolidinium salt include pyrrolidinium salts represented by the following formula (E01).

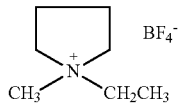

(E01)

As the ionic liquid, at least one of the ionic liquids represented by the formulae (B02), (B04), (B05), (B08), (D01), and (D02) is preferred among the ionic liquids represented by the above-described formulae. When an additive containing these ionic liquids is used, an etching solution that causes a high etching rate and reduced dust deposition can be achieved.

As the ionic liquid, at least one of the ionic liquids represented by the formulae (B02), (B05), and (B08) is more preferred. When an additive containing these ionic liquids is used, the etching rate of the etching solution can be further increased.

The additive according to the second embodiment may consist of, an ionic liquid. The additive according to the second embodiment may further contain at least one selected from the group consisting of a silicon compound, hydrogen fluoride, and a hydrogen fluoride product.

The silicon compound can function as a selection ratio improver. For example, the silicon compound dissolves in the etching stock solution described below and produces hydrosilicofluoric acid. Examples of the silicon compound include silicon nitride, silicon oxide, hydrosilicofluoric acid, or mixtures thereof.

As the silicon compound, fine particulate silicon oxide ($SiO_2$) is preferred. Since silicon oxide dissolves in the etching solution without hydrolysis as represented by the above-described formula (5), the composition of the etching solution can be easily controlled and dust is further hardly deposited.

Hydrogen fluoride and a hydrogen fluoride product can function as etching rate improvers. Examples of the hydrogen fluoride product include at least one selected from the group consisting of tetrafluoroboric acid ($HBF_4$) and hydrosilicofluoric acid ($H_2SiF_6$).

According to the above-described second embodiment, an additive can be provided. Since the additive contains an ionic liquid, the etching process efficiency of the etching solution can be increased.

Third Embodiment

An etching solution according to a third embodiment contains the additive according to the second embodiment and an acidic aqueous solution. The etching solution according to the third embodiment can be obtained by adding the additive according to the second embodiment to an etching stock solution.

The etching stock solution contains an acidic aqueous solution. An acid (hereinafter referred to as a first acid) contained in the etching stock solution is, for example, at least one selected from the group consisting of nitric acid, sulfuric acid, and phosphoric acid. Types of the first acid can be selected according to a target for etching. That is, when the target for etching is silicon nitride or silicon oxide, the first acid is preferably a mixed acid of phosphoric acid and sulfuric acid in which phosphoric acid is a main component. When the target for etching is silicon, the main component is preferably nitric acid.

The etching solution according to the third embodiment contains an ionic liquid and an acidic aqueous solution.

In the etching solution according to the third embodiment, the concentration of the ionic liquid is preferably 0.10% by mass or more and 0.35% by mass or less, more preferably 0.20% by mass or more and 0.30% by mass or less. When the ionic liquid concentration is high, the dust deposition can be reduced and the etching rate can be increased. However, if the ionic liquid concentration in the etching solution is excessively high, the etching solution froths and flow rate regulation becomes difficult, which may result in a decrease in the etching process efficiency.

When the etching solution according to the third embodiment contains phosphoric acid, the concentration of phosphoric acid is preferably 89% by mass or more and 93% by mass or less, more preferably 90% by mass or more and 92% by mass or less. When the phosphoric acid concentration is high, the temperature of the etching solution can be easily increased and the treatment efficiency can be easily increased. However, if the phosphoric acid concentration is excessively high, the content of water as an etchant decreases, which may result in a decrease in the etching rate.

In etching solution according to the third embodiment, water occupies the balance of the etching solution. The concentration of water in the etching solution according to the third embodiment is preferably 7% by mass or more and 10% by mass or less, and more preferably 8% by mass or more and 9% by mass or less. When the water concentration is high, the etching rate can be increased. However, if the water concentration in the etching solution is excessively high, the temperature of the etching solution during the etching process hardly increases, which may result in a decrease in the etching process efficiency.

The etching solution according to the third embodiment may further contain a silicon compound, hydrogen fluoride, or a hydrogen fluoride product.

As the silicon compounds, the silicon compounds as described in the etching solution according to the first embodiment can be used. The preferred ranges of the silicon compound concentration and the silica concentration in the etching solution according to the third embodiment may be the same as the preferred ranges of the silicon compound concentration and the silica concentration in the etching solution according to the first embodiment. As the hydrogen fluoride products, the hydrogen fluoride products as describe in the additive according to the second embodiment can be used.

The above-described etching solution according to the third embodiment contains an ionic liquid. Thus, when the etching solution according to the third embodiment is used, the etching process efficiency can be increased.

Fourth Embodiment

An etching method according to a fourth embodiment includes etching of silicon nitride using the etching solution according to the first embodiment.

In the etching method according to the fourth embodiment, etching of silicon nitride is carried out by, for example, bringing a processing target containing silicon nitride into contact with the etching solution according to the first embodiment for a certain time.

The etching method according to the fourth embodiment can be performed by using an etching apparatus. The etching apparatus is described with reference to FIG. 2. FIG. 2 is a cross sectional view schematically illustrating an example of a single wafer etching apparatus.

The single wafer etching apparatus 1 illustrated in FIG. 2 includes a processing part 510, an etching solution storage part 420, an etching solution preparation part 430, a water storage part 440, a first additive storage part 450, a second additive storage part 460, a third additive storage part 490, a fourth additive storage part 500, a high concentration phosphoric acid storage part 470, a low concentration phosphoric acid storage part 480, and a control unit (not shown). In FIG. 2, the direction of an arrow represents the liquid flow direction.

The single-wafer processing part 510 includes a processing tank 511 which accommodates an etching solution and a processing substrate SB1, a nozzle 512 which supplies the etching solution onto the processing substrate SB1, a rotation mechanism which rotates the processing substrate, and a recovery part 513. In FIG. 2, the rotation mechanism is omitted. The nozzle 512 is connected to an end of a line L13. The recovery part 513 includes a line L24 which connects a lower part of the processing tank 511 and a tank T1. The line L24 may include a filter for removing impurities.

The etching solution storage part 420 includes a tank T1 which accommodates the etching solution, a circulation part 421 which heats and circulates the etching solution, and detects the temperature of the etching solution and the concentration of each component, a supply part 422 which supplies the etching solution to the processing tank 511, and a discharge part 423 which discharges the etching solution outside.

The circulation part 421 includes a line L12 which connects a lower part of the tank T1 and an upper part of the tank T1. In the line L12, a pump P1, a heater TH1 equipped with a thermometer, and a densitometer D1 which can measure the concentration of each component contained in the etching solution are disposed. The pump P1, the densitometer D1, and the heater TH1 equipped with a thermometer are connected to the control unit (not shown). The line L12 may include a filter for removing impurities.

The supply part 422 includes a line L13 which connects the tank T1 and the processing tank 511. In the line L13, a valve V10 and a flowmeter F1 are disposed. The valve V10 and the flowmeter F1 are connected to the control unit (not shown).

The discharge part 423 includes a line L14 which connects a lower part of the tank T1 and the outside of the etching apparatus 1. In the line L14, a valve V11, a flowmeter F2, and a cooling unit CL1 are disposed. The valve V11, the flowmeter F2, and the cooling unit CL1 are connected to the control unit (not shown).

The etching solution preparation part 430 includes a tank T2 which accommodates raw materials of the etching solution or a buffer solution, and prepares the etching solution or the buffer solution, a circulation part 431 which circulates the etching solution or the buffer solution, and detects the concentration of each component in the etching solution or the buffer solution, and a supply part 432 which supplies the etching solution or the buffer solution to the tank T1.

The circulation part 431 includes a line L15 which connects a lower part of the tank T2 and an upper part of the tank T2. In the line L15, a pump P2 and a densitometer D2 which can measure the concentration of each component contained in the etching solution are disposed. The pump P2 and the densitometer D2 are connected to the control unit (not shown).

The supply part 432 includes a line L16 which connects the tank T2 and the tank T1. In the line L16, a valve V12 and a flowmeter F3 are disposed. The valve V12 and the flowmeter F3 are connected to the control unit (not shown).

The water storage part 440 includes a tank T3 which accommodates water ($H_2O$), a first supply part 441 which supplies water to the tank T2, and a second supply part 442 which supplies water to the tank T1.

The first supply part 441 includes a line L17 which connects the tank T3 and the tank T2. In the line L17, a pump P3, a valve V13, and a flowmeter F4 are disposed. The pump P3, the valve V13, and the flowmeter F4 are connected to the control unit (not shown).

The second supply part 442 includes a line L18 which connects the tank T3 and the line L16. In the line L18, a pump P4, a valve V14, and a flowmeter F5 are disposed. The pump P4, the valve V14, and the flowmeter F5 are connected to the control unit (not shown). The line L18 may be connected to the tank T1 instead of the line L16.

The first additive storage part 450 includes a tank T4 which accommodates a tetrafluoroboric acid aqueous solution, and a supply part 451 which supplies the tetrafluoroboric acid aqueous solution to the tank T2. The tetrafluoroboric acid concentration in the tetrafluoroboric acid aqueous solution is, for example, 42% by mass.

The supply part 451 includes a line L19 which connects the tank T4 and the line L17. In the line L19, a pump P5, a valve V15, and a flowmeter F6 are disposed. The pump P5, the valve V15, and the flowmeter F6 are connected to the control unit (not shown). The line L19 may be connected to the tank T2 instead of the line L17.

The second additive storage part 460 includes a tank T5 which accommodates a silicon compound dispersion, and a supply part 461 which supplies the silicon compound dispersion to the tank T2. The silicon compound concentration in the silicon compound dispersion is, for example, 12% by mass or more and 23% by mass or less. The dispersion medium of the silicon compound dispersion is, for example, water.

The supply part 461 includes a line L20 which connects the tank T5 and the line L19. In the line L20, a pump P6, a valve V16, and a flowmeter F7 are disposed. The pump P6, the valve V16, and the flowmeter F7 are connected to the control unit (not shown). The line L20 may be connected to the line L17 or the tank T2 instead of the line L19.

The third additive storage part 490 includes a tank T8 which accommodates a sulfuric acid aqueous solution, and a supply part 491 which supplies the sulfuric acid aqueous solution to the tank T2. The sulfuric acid concentration in the sulfuric acid aqueous solution is, for example, 98% by mass.

The supply part 491 includes a line L24 which connects the tank T8 and the line L19. In the line L24, a pump P9, a valve V20, and a flowmeter F11 are disposed. The pump P9, the valve V20, and the flowmeter F11 are connected to the control unit (not shown). The line L24 may be connected to the line L17 or the tank T2 instead of the line L19.

The fourth additive storage part 500 includes a tank T9 which accommodates an ionic liquid, and a supply part 501 which supplies the ionic liquid to the tank T2.

The supply part 501 includes a line L25 which connects the tank T9 and the line L19. In the line L25, a pump P10, a valve V21, and a flowmeter F12 are disposed. The pump P10, the valve V21, and the flowmeter F12 are connected to the control unit (not shown). The line L25 may be connected to the line L17 or the tank T2 instead of the line L19.

Any one of the third additive storage part 490 and the fourth additive storage part 500 may be omitted.

The high concentration phosphoric acid storage part 470 includes a tank T6 which accommodates a high concentration phosphoric acid aqueous solution, a circulation part 471 which heats and circulates the phosphoric acid aqueous solution, and thereby concentrate the phosphoric acid aqueous solution, and a supply part 472 which supplies the high concentration phosphoric acid aqueous solution to the tank T2. The phosphoric acid concentration in the high concentration phosphoric acid aqueous solution is, for example, 98% by mass.

The circulation part 471 includes a line L21 which connects a lower part of the tank T6 and an upper part of the tank T6, and a line L21a which connects a cooling unit CL2 equipped with a thermometer and the line L21. In the line L21, a heater TH2 equipped with a thermometer, a phosphoric acid densitometer D3, and a pump P7 are disposed. The heater TH2 equipped with a thermometer, the phosphoric acid densitometer D3, and the pump P7 are connected to the control unit (not shown).

The supply part 472 includes a line L22 which connects the tank T6 and the line L20. In the line L22, a valve V19, a flowmeter F10, a cooling unit CL2 equipped with a thermometer, a valve V17, and a flowmeter F8 are disposed. The valve V19, the flowmeter F10, the cooling unit CL2 equipped with a thermometer, the valve V17, and the flowmeter F8 are connected to the control unit (not shown). The line L22 may be connected to the line L19, the line L17, or the tank T2 instead of the line L20.

The low concentration phosphoric acid storage part 480 includes a tank T7 which accommodates a low concentration phosphoric acid aqueous solution, and a supply part 481 which supplies the low concentration phosphoric acid aqueous solution to the tank T6. The phosphoric acid concentration in the low concentration phosphoric acid aqueous solution is, for example, 85% by mass.

The supply part 481 includes a line L23 which connects the tank T7 and the tank T6. In the line L23, a pump P8, a valve V18, and a flowmeter F9 are disposed. The pump P8, the valve V18, and the flowmeter F9 are connected to the control unit (not shown).

In the single wafer etching apparatus 1 having a configuration as describe above, etching process is carried out according to the following first to twelfth operations under control of the control unit.

First, as the first operation, the valve V18 is opened, and the pump P8 and the flowmeter F9 are started. As a result, a predetermined amount of the low concentration phosphoric acid aqueous solution accommodated in the tank T7 is supplied to the tank T6.

Next, as the second operation, the heater TH2 equipped with a thermometer, the phosphoric acid densitometer D3, and the pump P7 are started. As a result, the low concentration phosphoric acid aqueous solution supplied to the tank T6 circulates through the tank T6 and the line L21, and heated to a predetermined temperature by the heater TH2 equipped with a thermometer. This operation is continued until the phosphoric acid concentration in the line L21 detected by the phosphoric acid densitometer D3 reaches a predetermined concentration. The high concentration phosphoric acid aqueous solution thus prepared is kept at a predetermined temperature and a predetermined concentration.

Next, as the third operation, the valve V19 and the valve V17 are opened, and the cooling unit CL2 equipped with a thermometer, the flowmeter F10, and the flowmeter F8 are started. As a result, a predetermined amount of the high concentration phosphoric acid aqueous solution accommodated in the tank T6 is cooled to a predetermined temperature by the cooling unit CL2 equipped with a thermometer, and then supplied to the tank T2. If the high concentration phosphoric acid aqueous solution has not been cooled to the predetermined temperature by the cooling unit CL2 equipped with a thermometer, the high concentration phosphoric acid aqueous solution is collected in the circulation part 471 through the line L21a. As a result, only the sufficiently cooled high concentration phosphoric acid aqueous solution cooled by the cooling unit CL2 equipped with a thermometer is supplied to the tank T2.

Next, as the fourth operation, the valve V13 is opened, and the pump P3 and the flowmeter F4 are started. As a result, a predetermined amount of water accommodated in the tank T3 is supplied to the tank T2.

Next, as the fifth operation, the valve V15 is opened, and the pump P5 and the flowmeter F6 are started. As a result, a predetermined amount of the tetrafluoroboric acid aqueous solution accommodated in the tank T4 is supplied to the tank T2.

Next, as the sixth operation, the valve V16 is opened, and the pump P6 and the flowmeter F7 are started. As a result, a predetermined amount of the silicon compound dispersion accommodated in the tank T5 is supplied to the tank T2.

Next, as the seventh operation, the valve V20 is opened, and the pump P9 and the flowmeter F11 are started. As a result, a predetermined amount of the sulfuric acid aqueous solution accommodated in the tank T8 is supplied to the tank T2.

Next, as the eighth operation, the valve V21 is opened, and the pump P10 and the flowmeter F12 are started. As a result, a predetermined amount of the ionic liquid accommodated in the tank T9 is supplied to the tank T2.

Herein, any one of the seventh operation and the eighth operation can be omitted.

Next, as the ninth operation, the pump P2 and the densitometer D2 are started. As a result, the high concentration phosphoric acid aqueous solution, water, silicon compound dispersion, sulfuric acid aqueous solution, and ionic liquid supplied to the tank T2 are thoroughly mixed while circulating through the tank T2 and the line L15. The densitometer D2 detects the phosphoric acid concentration, the sulfuric acid concentration, the tetrafluoroboric acid concentration, the silicon compound concentration, and the ionic liquid concentration in the solution circulating through the line L15, and transmits the information to the control unit (not shown) through wiring (not shown). Based on this information, the control unit controls the amounts supplied and the temperatures of the high concentration phosphoric acid aqueous solution, water, sulfuric acid aqueous solution, tetrafluoroboric acid, silicon compound, and ionic liquid. In this manner, an etching solution is prepared. The etching solution thus prepared is maintained at a predetermined temperature and a predetermined composition. When the silicon compound source is solid, the silicon compound source is dissolved in the etching solution.

Next, as the tenth operation, the valve V12 is opened, and the flowmeter F3 is started. As a result, a predetermined amount of the etching solution accommodated in the tank T2 is supplied to the tank T1.

Next, as the eleventh operation, the pump P1, the heater TH1 equipped with a thermometer, and the densitometer D1 are started. As a result, the etching solution supplied to the tank T1 circulates through the tank T1 and the line L2, and heated to a predetermined temperature by the heater TH1 equipped with a thermometer. The densitometer D1 detects the phosphoric acid concentration, the sulfuric acid concentration, the tetrafluoroboric acid concentration, the silicon compound concentration, and the ionic liquid concentration in the solution circulating through the line L2, and transmits the information to the control unit through wiring (not shown).

Next, as the twelfth operation, based on the information transmitted to the control unit, the control unit prepares a buffer solution and controls the temperature of the buffer solution. More specifically, at a high temperature, water and others can be evaporated from the etching solution. Thus, in order to prevent changes in the composition of the etching solution caused by the decrease in the concentration, the control unit supplies water and a buffer solution to the tank T1. When water is supplied, the valve V14 is opened, and the pump P4 and the flowmeter F5 are started. As a result, water is supplied to the tank T1 such that the etching solution has a predetermined composition. When the buffer solution is supplied, the first to tenth operations are repeated to prepare the buffer solution for adjusting the composition of the etching solution, and the buffer solution is supplied to the tank T1. As a result, the components of the etching solution in the tank T1 are controlled so that the etching solution always has a predetermined composition. The twelfth operation may be carried out also in the following thirteenth operation and fourteenth operation.

Next, as the thirteenth operation, the processing substrate SB1 is mounted on the rotation mechanism in the processing tank 511. Subsequently, the rotation mechanism is started, and the processing substrate SB1 is rotated at a predetermined speed.

Next, as the fourteenth operation, the valve V10 is opened, and the flowmeter F1 is started. As a result, the etching solution is supplied onto the rotating processing substrate SB1 through the nozzle 512 connected to the line L13. Consequently, silicon nitride in the processing substrate SB1 can be selectively etched. After the elapse of a predetermined amount of time, the processing substrate SB1 is taken out from the processing tank 511, and dried. The etching solution accumulated in the lower part of the processing tank 511 is collected in the tank T1 through the line L24.

The processing substrate SB1 can be continuously processed by repeating all of the above-described first to fourteenth operations, or by repeating the eleventh to fourteenth operations. When the etching process is completed, or when the amount of impurities in the etching solution exceedingly increases, the valve V11 is opened, the flowmeter F2 and the cooling unit CL1 are started, and thereby the etching solution is discharged to the outside of the apparatus.

Although an etching apparatus including an etching solution preparation mechanism is described above as an example, the etching solution may be prepared outside of the etching apparatus 1. In this case, the first additive storage part 450, the second additive storage part 460, the third additive storage part 490, the fourth additive storage part 500, the high concentration phosphoric acid storage part 470, and the low concentration phosphoric acid storage part 480 may be omitted. In addition, the etching solution preparation part 430 may be omitted.

When the etching solution according to the first embodiment is used, a high selection ratio of, for example, 50 or more, or 100 or more can be achieved. Accordingly, the etching solution according to the first embodiment can be preferably used as an etching solution for a single wafer etching apparatus. As an etching apparatus, a batch etching apparatus may be used instead.

In the etching method according to the fourth embodiment, since the etching solution according to the first embodiment is used, high etching process efficiency can be achieved.

Fifth Embodiment

An etching method according to a fifth embodiment includes etching of silicon or a silicon containing substance using the etching solution according to the third embodiment. The silicon containing substance is, for example, silicon oxide or silicon nitride.

In the etching method according to the fifth embodiment, etching of silicon or a silicon containing substance is carried out by, for example, bringing a processing target containing silicon nitride into contact with the etching solution according to the third embodiment for a certain time.

The etching method according to the fifth embodiment can be performed by using an etching apparatus. As the etching apparatus, the etching apparatus represented by FIG. 2 can be used. For example, when etching of silicon nitride is carried out, the etching apparatus may be the same as the above-described etching apparatus 1 except that the additive according to the second embodiment is accommodated in the first additive storage part 450, and the second to fourth additive storage parts are omitted. In addition, the etching apparatus may be the same as the above-described etching apparatus 1 except that an aqueous solution of the above-described hydrogen fluoride product is accommodated in the second additive storage part 460. When etching of silicon is carried out, the etching apparatus may be the same as the above-described etching apparatus 1 except that nitric acid is accommodated in the high concentration phosphoric acid storage part 470, and the low concentration phosphoric acid storage part 480 is omitted.

In the etching method according to the fifth embodiment, since the etching solution according to the third embodiment is used, high etching process efficiency can be achieved.

EXAMPLES

Examples of the present invention are described below.

Example 1 to Example 4

Etching solutions according to Example 1 to Example 4 having compositions shown in Table 1 were prepared using an ionic liquid ($C_6H_{11}BF_4N_2O$) represented by the above-described formula (B05).

Example 5 to Example 8

Etching solutions according to Example 5 to Example 8 having compositions shown in Table 2 were prepared using an ionic liquid ($C_7H_{13}BF_4N_2$) represented by the above-described formula (B08).

Example 9 to Example 12

Etching solutions according to Example 9 to Example 12 having compositions shown in Table 3 were prepared using an ionic liquid ($C_8H_{15}BF_4N_2$) represented by the above-described formula (B02).

Example 13

An etching solution according to Example 13 having a composition shown in Table 4 was prepared using an ionic liquid ($C_{12}H_{23}BF_4N_2$) represented by the above-described formula (B04).

Examples 14 and 15

Etching solutions according to Examples 14 and 15 having compositions shown in Table 5 were prepared using an ionic liquid ($C_9H_{14}BF_4N$) represented by the above-described formula (D01).

Examples 16 and 17

Etching solutions according to Examples 16 and 17 having compositions shown in Table 6 were prepared using an ionic liquid ($C_{10}H_{16}BF_4N$) represented by the above-described formula (D02).

Examples 18 to 23, and Comparative Examples 1 to 7

Etching solutions according to Examples 18 to 23, and Comparative Examples 1 to 7 having compositions shown in Table 7 were prepared using an ionic liquid ($C_7H_{13}BF_4N_2$) represented by the above-described formula (B08) or sulfuric acid.

<Measurement of Etching Rate>

First, as a base material, a 2.5-cm square single crystal silicon plate was prepared. Next, silicon oxide films and silicon nitride films were formed on the base material so that the films were arranged alternately in parallel with each other in a direction perpendicular to the main surface of the base material to obtain a processing substrate. The thickness of the silicon oxide film and the thickness of the silicon nitride film in the processing substrate were measured using a spectroscopic ellipsometer (M-2000, manufactured by J. A. Woollam). The measurements were performed at nine points, and the average thickness of the silicon oxide film and the average thickness of the silicon nitride film before processing were obtained.

Next, the etching solution was poured into a beaker, and the beaker was mounted on a mantle heater stirrer. In the mounted beaker, the etching solution was heated with stirring at 100 rpm. After the temperature of the etching solution in the beaker reached a maximum temperature, the processing substrate was immersed in the etching solution, and the etching solution was stirred at 100 rpm for 15 minutes, thereby carrying out etching process. Subsequently, the processing substrate was taken out from the etching solution, the processing substrate was washed with pure water for 1 minute, and then nitrogen ($N_2$) gas was blown on the processing substrate, thereby drying the processing substrate.

The film thickness of the silicon nitride film and the film thickness of the silicon oxide film in the etching processed substrate were measured using a spectroscopic ellipsometer. The measurements were performed at nine points, and the average thickness of the silicon oxide film and the average thickness of the silicon nitride film after processing were obtained. A difference was calculated by subtraction of the average thickness of the silicon nitride film after processing from the average thickness of the silicon nitride film before processing, and the difference was divided by the process time to obtain the etching rate of silicon nitride. Also, a difference was calculated by subtraction of the average thickness of the silicon oxide film after processing from the average thickness of the silicon oxide film before processing, and the difference was divided by the process time to obtain the etching rate of silicon oxide.

Next, the ratio of the etching rate of silicon nitride $ER_{SiN}$ to the etching rate of silicon oxide $ER_{SiO}$ was calculated to obtain the selection ratio $ER_{SiN}/ER_{SiO}$. The results are shown in Table 1 to Table 7.

<Determination of Precipitate>

The mount of whitish materials deposited in an etching solution after etching process was visually evaluated. Etching solutions in which no or small amount of precipitates were deposited received a precipitation grade 1, some precipitates were deposited received a precipitation grade 2, and a large amount of precipitates were deposited received a precipitation grade 3. The results are shown in Table 1 to Table 7.

TABLE 1

| | Phosphoric acid [mass %] | $C_6H_{11}BF_4N_2O$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 1 | 91.24 | 0.302 | 1098 | 8.40 | 165° C. | 29.25 | 0.2 | 146 |
| Example 2 | 91.33 | 0.203 | 1097 | 8.40 | 165° C. | 22.82 | 0.02 | 1141 |
| Example 3 | 91.23 | 0.303 | 889 | 8.42 | 165° C. | 26.44 | 0.54 | 49 |
| Example 4 | 91.20 | 0.303 | 965 | 8.45 | 165° C. | 26.53 | 0.42 | 63 |

TABLE 2

| | Phosphoric acid [mass %] | $C_7H_{13}BF_4N_2$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 5 | 91.24 | 0.302 | 1098 | 8.40 | 165° C. | 29.29 | 0.16 | 183 |
| Example 6 | 91.33 | 0.204 | 1097 | 8.40 | 165° C. | 22.73 | 0.01 | 2273 |
| Example 7 | 91.23 | 0.301 | 889 | 8.42 | 165° C. | 25.68 | 0.51 | 50 |
| Example 8 | 91.2 | 0.300 | 964 | 8.45 | 165° C. | 26.56 | 0.49 | 54 |

TABLE 3

| | Phosphoric acid [mass %] | $C_8H_{15}BF_4N_2$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 9 | 91.22 | 0.321 | 1092 | 8.39 | 165° C. | 29.10 | 0.17 | 171 |
| Example 10 | 91.32 | 0.215 | 1096 | 8.40 | 165° C. | 24.70 | 0.03 | 823 |
| Example 11 | 91.23 | 0.301 | 889 | 8.42 | 165° C. | 26.89 | 0.47 | 57 |
| Example 12 | 91.20 | 0.301 | 964 | 8.45 | 165° C. | 26.12 | 0.28 | 93 |

TABLE 4

| | Phosphoric acid [mass %] | $C_{12}H_{23}BF_4N_2$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 13 | 91.27 | 0.272 | 1095 | 8.40 | 165° C. | 15.02 | 0.01 | 1502 |

TABLE 5

| | Phosphoric acid [mass %] | $C_9H_{14}BF_4N$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 14 | 91.21 | 0.317 | 1092 | 8.41 | 165° C. | 25.56 | 0.09 | 284 |
| Example 15 | 91.31 | 0.215 | 1096 | 8.41 | 165° C. | 15.14 | 0.01 | 1514 |

TABLE 6

| | Phosphoric acid [mass %] | $C_{10}H_{16}BF_4N$ [mass %] | Colloidal silica [ppm] | $H_2O$ [mass %] | Solution temperature (Max) | SiN etching rate [nm/min] | $SiO_2$ etching rate [nm/min] | Selection ratio |
|---|---|---|---|---|---|---|---|---|
| Example 16 | 91.23 | 0.317 | 1092 | 8.39 | 165° C. | 25.41 | 0.04 | 635 |
| Example 17 | 91.31 | 0.229 | 1096 | 8.40 | 165° C. | 15.41 | 0.01 | 1541 |

TABLE 7

| | Phosphoric acid [mass %] | $HBF_4$ [mass %] | Colloidal silica [ppm] | $H_2O$ [mass %] | $H_2SO_4$ [mass %] | $C_7H_{13}BF_4N_2$ [mass %] | SiN etching rate [nm/min] | $SiO_2$ etching rate [nm/min] | Selection ratio | Determination of Precipitate |
|---|---|---|---|---|---|---|---|---|---|---|
| Comparative Example 1 | 91.16 | 0.20 | 2500 | 8.50 | 0.00 | 0 | 24.33 | 0.00 | ∞ | 3 |
| Example 18 | 78.16 | 0.20 | 2500 | 8.50 | 13.00 | 0 | 30.95 | 0.00 | ∞ | 2 |
| Example 19 | 66.16 | 0.20 | 2500 | 8.50 | 25.00 | 0 | 30.93 | 0.00 | ∞ | 2 |
| Example 20 | 91.16 | 0.00 | 2500 | 8.40 | 0.00 | 0.30 | 20.27 | 0.00 | ∞ | 1 |
| Example 21 | 91.17 | 0.01 | 2500 | 8.40 | 0.00 | 0.27 | 20.92 | 0.00 | ∞ | 1 |
| Example 22 | 91.24 | 0.06 | 2500 | 8.40 | 0.00 | 0.15 | 18.60 | 0.00 | ∞ | 1 |
| Example 23 | 91.32 | 0.11 | 2500 | 8.40 | 0.00 | 0.03 | 19.38 | 0.00 | ∞ | 1 |
| Comparative Example 2 | 89.78 | 0.15 | 1100 | 10.01 | 0 | 0 | 26.46 | 0.28 | 94.50 | 3 |
| Comparative Example 3 | 88.79 | 0.15 | 1100 | 11.00 | 0 | 0 | 25.72 | 0.48 | 53.58 | 3 |
| Comparative Example 4 | 91.24 | 0.20 | 1100 | 8.50 | 0 | 0 | 28.40 | 0.24 | 118.00 | 1 |
| Comparative Example 5 | 91.24 | 0.20 | 1050 | 8.50 | 0 | 0 | 27.93 | 0.37 | 75.00 | 1 |

TABLE 7-continued

| | Phosphoric acid [mass %] | HBF$_4$ [mass %] | Colloidal silica [ppm] | H$_2$O [mass %] | H$_2$SO$_4$ [mass %] | C$_7$H$_{13}$BF$_4$N$_2$ [mass %] | SiN etching rate [nm/min] | SiO$_2$ etching rate [nm/min] | Selection ratio | Determination of Precipitate |
|---|---|---|---|---|---|---|---|---|---|---|
| Comparative Example 6 | 91.24 | 0.20 | 990 | 8.50 | 0 | 0 | 27.28 | 0.55 | 50.00 | 1 |
| Comparative Example 7 | 91.25 | 0.20 | 880 | 8.50 | 0 | 0 | 27.99 | 0.69 | 41.00 | 1 |

As shown in Table 7, when the colloidal silica concentration was 2,500 ppm, Examples 18 to 23 in which sulfuric acid or an ionic liquid was included achieved a high selection ratio and reduction of precipitates. On the other hand, in Comparative Example 1 in which no sulfuric acid or ionic liquid was included, a high selection ratio was achieved, but a large amount of precipitates were produced. Further, as shown in Table 7, Examples 20 to 23 in which etching solutions containing an ionic liquid were used were superior in reduction of precipitates to Examples 18 to 19 in which etching solutions containing sulfuric acid were used.

In addition, as shown in Table 1 to Table 6, Examples 1 to 17 in which etching solutions containing an ionic liquid were used achieved an excellent selection ratio.

FIG. 3 is a graph showing an example of the relationship between the colloidal silica concentration and the selection ratio. The graph shown in FIG. 3 is based on Examples 1, 3, and 4, Examples 5, 7, and 8, Examples 9, 11, and 12, and Comparative Examples 3 to 6. As shown in FIG. 3, etching solutions using ionic liquids represented by the formulae (B02), (B05), and (B08) as hydrogen fluoride sources achieved a superior selection ratio as compared to etching solutions using tetrafluoroboric acid as a hydrogen fluoride source.

An etching solution according to at least one embodiment described above includes phosphoric acid, tetrafluoroboric acid, a silicon compound, water, and at least one of sulfuric acid and an ionic liquid. Accordingly, when the etching solutions according to the embodiments are used, deposition of dust such as silicon dioxide which can be deposited in the etching solution after etching process can be reduced while a high selection ratio is achieved. Thus, when the etching solutions according to the embodiments are used, the etching process efficiency can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching solution, consisting of:
   phosphoric acid;
   water;
   an ionic liquid; and
   colloidal silica,
   wherein the ionic liquid includes an anion selected from the group consisting of $BF_4^-$ and $PF_6^-$, and a cation selected from the group consisting of an imidazolium skeleton, a pyridinium skeleton, a quaternary phosphonium skeleton, a pyrrolidinium skeleton, a morpholinium skeleton, a piperidinium skeleton, and a sulfonium skeleton, and
   wherein a concentration of the ionic liquid is 0.10% by mass or more and. 0.35% by mass or less.

2. The etching solution according to claim 1, wherein a concentration of silica in the etching solution is 880 ppm or more and 2,500 ppm or less.

3. The etching solution according to claim 1, wherein a concentration of water is 7% by mass or more and 10% by mass or less.

4. The etching solution according to claim 1, wherein a concentration of the phosphoric acid is 89% by mass or more and 93% by mass or less.

5. An etching method comprising selectively etching silicon nitride from a structure containing silicon nitride and silicon oxide using the etching solution according to claim 1.

* * * * *